(12) United States Patent
Rahman et al.

(10) Patent No.: US 9,152,051 B2
(45) Date of Patent: Oct. 6, 2015

(54) ANTIREFLECTIVE COATING COMPOSITION AND PROCESS THEREOF

(71) Applicants: M. Dalil Rahman, Flemington, NJ (US);
Clement Anyadiegwu, Parlin, NJ (US);
Douglas McKenzie, Easton, PA (US);
Takanori Kudo, Bedminster, NJ (US);
Elizabeth Wolfer, Bethlehem, PA (US);
Salem K. Mullen, Florham Park, NJ (US)

(72) Inventors: M. Dalil Rahman, Flemington, NJ (US);
Clement Anyadiegwu, Parlin, NJ (US);
Douglas McKenzie, Easton, PA (US);
Takanori Kudo, Bedminster, NJ (US);
Elizabeth Wolfer, Bethlehem, PA (US);
Salem K. Mullen, Florham Park, NJ (US)

(73) Assignee: AZ ELECTRONICS MATERIALS (LUXEMBOURG) S.A.R.L., Luxembourg (LU)

( * ) Notice: Subject to any disclaimer, the term of this patent is extended or adjusted under 35 U.S.C. 154(b) by 61 days.

(21) Appl. No.: 13/917,022

(22) Filed: Jun. 13, 2013

(65) Prior Publication Data

US 2014/0370444 A1 Dec. 18, 2014

(51) Int. Cl.
G03F 7/09 (2006.01)
G03F 7/30 (2006.01)
G03F 7/075 (2006.01)
C09D 165/00 (2006.01)
C09D 5/00 (2006.01)

(52) U.S. Cl.
CPC ............... *G03F 7/091* (2013.01); *C09D 5/006* (2013.01); *C09D 165/00* (2013.01); *G03F 7/0752* (2013.01); *G03F 7/0757* (2013.01); *G03F 7/30* (2013.01); *C08G 2261/314* (2013.01); *C08G 2261/3424* (2013.01)

(58) Field of Classification Search
None
See application file for complete search history.

(56) References Cited

U.S. PATENT DOCUMENTS

| | | |
|---|---|---|
| 3,474,054 A | 10/1969 | White |
| 4,200,729 A | 4/1980 | Calbo |
| 4,251,665 A | 2/1981 | Calbo |
| 4,491,628 A | 1/1985 | Ito et al. |
| 5,187,019 A | 2/1993 | Calbo et al. |
| 5,350,660 A | 9/1994 | Urano et al. |
| 5,629,355 A | 5/1997 | Kuczynski |
| 5,843,624 A | 12/1998 | Houlihan et al. |
| 6,268,072 B1 | 7/2001 | Zheng et al. |
| 6,447,980 B1 | 9/2002 | Rahman et al. |
| 6,723,488 B2 | 4/2004 | Kudo et al. |
| 6,790,587 B1 | 9/2004 | Feiring et al. |
| 6,818,258 B2 | 11/2004 | Kaneko et al. |
| 6,849,377 B2 | 2/2005 | Feiring et al. |
| 6,866,984 B2 | 3/2005 | Jung et al. |
| 6,916,590 B2 | 7/2005 | Kaneko et al. |
| 7,060,410 B2 | 6/2006 | Ohnishi et al. |
| 7,405,029 B2 | 7/2008 | Oh et al. |
| 7,632,622 B2 | 12/2009 | Uh et al. |
| 7,691,556 B2 | 4/2010 | Wu et al. |
| 7,754,414 B2 | 7/2010 | Oberlander |
| 7,932,018 B2 | 4/2011 | McKenzie et al. |
| 7,989,144 B2 | 8/2011 | Rahman et al. |
| 8,017,296 B2 | 9/2011 | Houlihan et al. |
| 8,445,187 B2 | 5/2013 | Yoon et al. |
| 8,465,902 B2 | 6/2013 | Yao et al. |
| 8,486,609 B2 | 7/2013 | Rahman et al. |
| 8,906,590 B2 | 12/2014 | Rahman et al. |
| 8,906,592 B2 | 12/2014 | Rahman et al. |
| 2004/0181909 A1 | 9/2004 | Kawamoto |
| 2005/0058929 A1 | 3/2005 | Kennedy et al. |
| 2006/0234158 A1 | 10/2006 | Hatakeyama |
| 2006/0251990 A1 | 11/2006 | Uh et al. |
| 2007/0059635 A1 | 3/2007 | Oh et al. |
| 2007/0148586 A1 | 6/2007 | Uh et al. |
| 2008/0005441 A1 | 1/2008 | Droux et al. |
| 2008/0153033 A1 | 6/2008 | Hyun et al. |
| 2008/0160460 A1 | 7/2008 | Yoon et al. |
| 2008/0160461 A1 | 7/2008 | Yoon et al. |
| 2008/0292987 A1 | 11/2008 | Houlihan et al. |
| 2008/0305441 A1* | 12/2008 | Yoon et al. ............ 430/323 |

Imaging Process of a Trilayer

| | | |
|---|---|---|
| 2009/0176165 A1 | 7/2009 | Cheon et al. |
| 2010/0021830 A1 | 1/2010 | Kim et al. |
| 2010/0119979 A1 | 5/2010 | Rahman et al. |
| 2010/0119980 A1 | 5/2010 | Rahman et al. |
| 2010/0151392 A1 | 6/2010 | Rahman et al. |
| 2010/0316949 A1 | 12/2010 | Rahman et al. |
| 2010/0316950 A1 | 12/2010 | Oguro et al. |
| 2011/0151376 A1 | 6/2011 | Rahman et al. |
| 2011/0178252 A1 | 7/2011 | Sung et al. |
| 2012/0153424 A1 | 6/2012 | Oh et al. |
| 2012/0168894 A1 | 7/2012 | Kim et al. |
| 2012/0181251 A1 | 7/2012 | Minegishi et al. |
| 2012/0251943 A1 | 10/2012 | Rahman et al. |
| 2012/0251956 A1 | 10/2012 | Rahman et al. |
| 2012/0252218 A1 | 10/2012 | Kori et al. |
| 2012/0326140 A1 | 12/2012 | Fukushima et al. |
| 2013/0158165 A1 | 6/2013 | Han et al. |
| 2014/0038109 A1 | 2/2014 | Rahman et al. |

FOREIGN PATENT DOCUMENTS

| | | |
|---|---|---|
| EP | 1 995 636 A1 | 11/2008 |
| JP | 8-301980 A | 11/1996 |
| JP | 2005-19055 A | 1/2005 |
| JP | 2009-14816 A | 1/2009 |
| JP | 2010-271654 A | 12/2010 |
| JP | 2012-207007 A | 10/2012 |
| KR | 10-2010-0072660 A | 7/2010 |

OTHER PUBLICATIONS

Final Office Action mail date Jan. 9, 2014 for U.S. Appl. No. 13/351,681.
Notice of Allowance notification date Aug. 20, 2014 for U.S. Appl. No. 13/351,681.
English Language Abstract from Espacenet of KR 10-2010-0072660 A, (2010).
Form PCT/ISA/220, Form PCT/ISA/210, and Form PCT/ISA/237 for PCT/IB2012/000632 dated Jun. 19, 2012, which corresponds to U.S. Appl. No. 13/351,681.
Notice of Allowance notification date Sep. 25, 2014 for U.S. Appl. No. 13/563,877.
Form PCT/IB/326, Form PCT/IB/373, and Form PCT/ISA/237 dated Oct. 10, 2013 for PCT/IB2012/000632, which corresponds to U.S. Appl. No. 13/075,749.
Office Action mail date Jul. 5, 2013 for U.S. Appl. No. 13/351,681.
Office Action mail date Aug. 27, 2013 for U.S. Appl. No. 13/351,681.
Office Action mail date Jun. 13, 2014 for U.S. Appl. No. 13/563,877.
Office Action mail date May 9, 2014 for U.S. Appl. No. 13/351,681.
Advisory Action Before the Filing of an Appeal notification date Apr. 15, 2014 for U.S. Appl. No. 13/351,681.
Notification of the First Office Action and Search Report from the Chinese Patent Office for CN201280015041.7 dated Feb. 16, 2015, which corresponds to U.S. Appl. No. 13/351,681.
English Translation of Notification of the First Office Action and Search Report from the Chinese Patent Office for CN201280015041.7 dated Feb. 16, 2015, which corresponds to U.S. Appl. No. 13/351,681.

\* cited by examiner

*Primary Examiner* — Sin Lee
(74) *Attorney, Agent, or Firm* — Sangya Jain

(57) ABSTRACT

The present invention relates to an absorbing hard mask antireflective coating composition comprising a novel polymer, where the novel polymer comprises in the backbone of the polymer four repeat units -A-, -B-, -C- and -D-, where A is repeat unit which comprises a fused aromatic ring in its backbone, B has the structure (1), C is a hydroxylbiphenyl of structure (2) and D is a derivatized fluorene of structure (3),

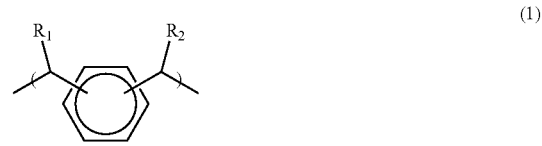

(1)

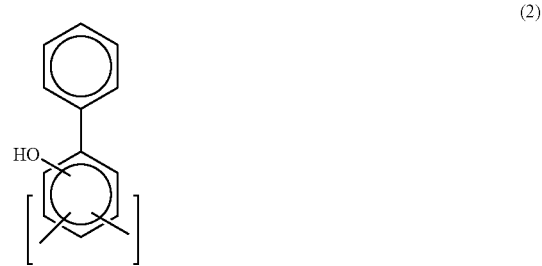

(2)

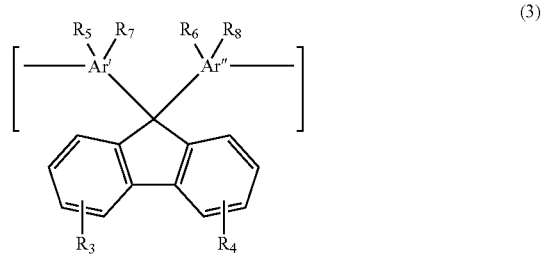

(3)

where $R_1$ is $C_1$-$C_4$ alkyl, $R_2$ is $C_1$-$C_4$ alkyl, $R_3$ and $R_4$ are independently hydrogen or $C_1$-$C_4$ alkyl, and Ar' and Ar" are independently phenylenic, or naphthalenic derived moieties, $R_5$ and $R_6$ are independently —OH or —$(CH_2)_n$OH where n=2-4, and $R_7$ and $R_8$ are independently hydrogen or $C_1$-$C_4$ alkyl. This invention also relates to a process for forming an image using the novel antireflective coating composition.

20 Claims, 1 Drawing Sheet

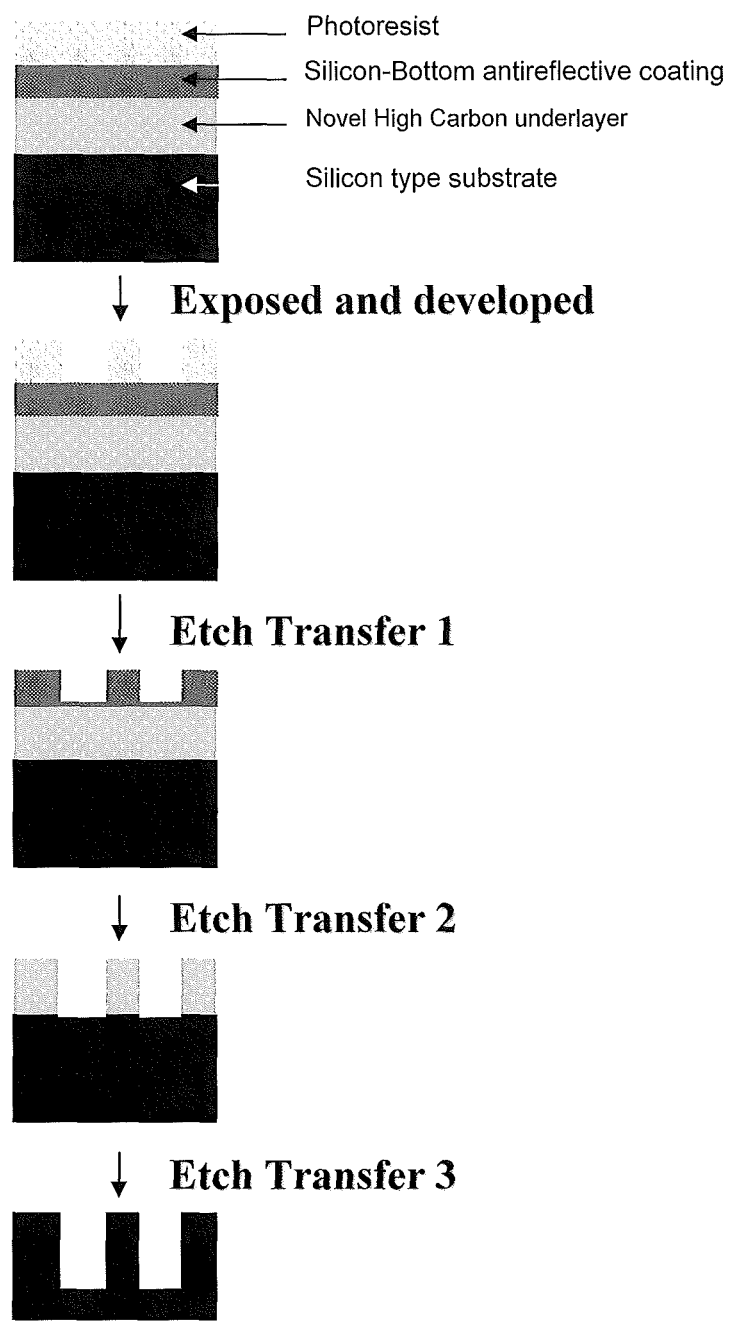
Imaging Process of a Trilayer

ANTIREFLECTIVE COATING COMPOSITION AND PROCESS THEREOF

The present invention relates to a novel absorbing hard mask antireflective coating composition comprising at least one polymer capable of crosslinking and the invention also relates to a process for imaging a photoresist layer coated above the novel antireflective coating layer.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon based wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

Absorbing antireflective coatings and underlayers in photolithography are used to diminish problems that result from back reflection of light from highly reflective substrates. Two major disadvantages of back reflectivity are thin film interference effects and reflective notching. Thin film interference, or standing waves, result in changes in critical line width dimensions caused by variations in the total light intensity in the photoresist film as the thickness of the photoresist changes or interference of reflected and incident exposure radiation can cause standing wave effects that distort the uniformity of the radiation through the thickness. Reflective notching becomes severe as the photoresist is patterned over reflective substrates containing topographical features, which scatter light through the photoresist film, leading to line width variations, and in the extreme case, forming regions with complete photoresist loss. An antireflective coating coated beneath a photoresist and above a reflective substrate provides significant improvement in lithographic performance of the photoresist. Typically, the bottom antireflective coating is applied on the substrate and then a layer of photoresist is applied on top of the antireflective coating. The antireflective coating is cured to prevent intermixing between the antireflective coating and the photoresist. The photoresist is exposed imagewise and developed. The antireflective coating in the exposed area is then typically dry etched using various etching gases, and the photoresist pattern is thus transferred to the substrate. Multiple antireflective layers and underlayers are being used in new lithographic techniques. In cases where the photoresist does not provide sufficient dry etch resistance, underlayers or antireflective coatings for the photoresist that act as a hard mask and are highly etch resistant during substrate etching are preferred, and one approach has been to incorporate silicon into a layer beneath the organic photoresist layer. Additionally, another high carbon content antireflective or mask layer is added beneath the silicon antireflective layer, which is used to improve the lithographic performance of the imaging process. The silicon layer may be spin coatable or deposited by chemical vapor deposition. Silicon is highly etch resistant in processes where $O_2$ etching is used, and by providing an organic mask layer with high carbon content beneath the silicon antireflective layer, a very large aspect ratio can be obtained. Thus, the organic high carbon mask layer can be much thicker than the photoresist or silicon layer above it. The organic mask layer can be used as a thicker film and can provide better substrate etch masking that the original photoresist.

The present invention relates to a novel organic spin coatable antireflective coating composition or organic mask underlayer which has high carbon content, and can be used between a photoresist layer and the substrate as a single layer of one of multiple layers. Typically, the novel composition can be used to form a layer beneath an essentially etch resistant antireflective coating layer, such as a silicon antireflective coating. The high carbon content in the novel antireflective coating, also known as a carbon hard mask underlayer, allows for a high resolution image transfer with high aspect ratio. The novel composition is useful for imaging photoresists, and also for etching the substrate. The novel composition enables a good image transfer from the photoresist to the substrate, and also reduces reflections and enhances pattern transfer. Additionally, substantially no intermixing is present between the antireflective coating and the film coated above it. The antireflective coating also has good solution stability and forms films with good coating quality, the latter being particularly advantageous for lithography.

The novel antireflective coating composition of the present invention provides for improved solubility and coating uniformity when using the novel polymer of the invention while maintaining other lithographic properties such as high carbon content, low weight loss (as detected by thermogravimetric analysis) adequate via filling and plasma etch rate.

SUMMARY OF THE INVENTION

The present invention relates to an absorbing hard mask antireflective coating composition comprising a novel polymer, where the novel polymer comprises in the backbone of the polymer four repeat units -A-, -B-, -C- and -D-, where A is repeat unit which comprises a fused aromatic ring in its backbone, B has the structure (1), C is a hydroxylbiphenyl of structure (2) and D is a derivatized fluorene of structure (3),

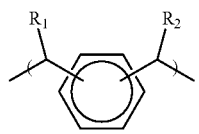
(1)

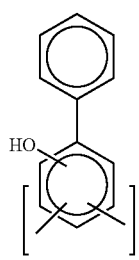
(2)

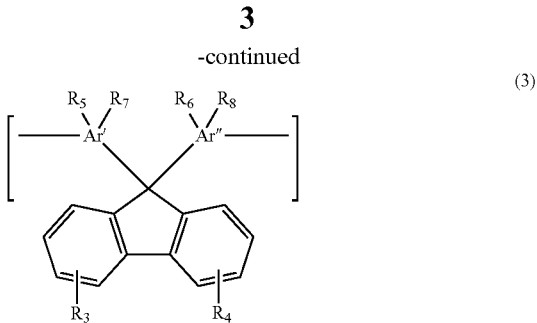

where $R_1$ is $C_1$-$C_4$alkyl, $R_2$ is $C_1$-$C_4$alkyl, $R_3$ and $R_4$ are independently hydrogen or $C_1$-$C_4$ alkyl, and Ar' and Ar" are independently phenylenic, or naphthalenic derived moieties, $R_5$ and $R_6$ are independently —OH or —$(CH_2)_n$OH where n=2-4, and $R_7$ and $R_8$ are independently hydrogen or $C_1$-$C_4$ alkyl. This invention also relates to a process for forming an image using the novel antireflective coating composition. The process is especially useful for imaging photoresists using radiation in the deep and extreme ultraviolet (uv) region.

BRIEF DESCRIPTION OF DRAWINGS

FIG. 1 illustrates a process of imaging.

DETAILED DESCRIPTION OF THE INVENTION

The present invention relates to a novel absorbing antireflective coating composition comprising a novel polymer capable of being crosslinked, where the novel polymer comprises at least one repeat unit with a fused aromatic group in the backbone of the polymer, at least repeat unit with a phenyl group in the backbone of the polymer, at least one repeat unit with a hydroxybiphenyl group and at least one repeat unit where a 9,9'-bis(hydroxyaryl)fluorene group is in the backbone of the polymer. The invention also relates to a process for imaging a photoresist layer coated above the novel antireflective coating layer.

The following definition apply, unless a more specific definition is described in the text. Aryl or aromatic groups contain 6 to 24 carbon atoms including phenyl, tolyl, xylyl, naphthyl, anthracyl, biphenyls, bis-phenyls, tris-phenyls and the like. These aryl groups may further be substituted with any of the appropriate substituents e.g. alkyl, alkoxy, acyl or aryl groups mentioned hereinabove. Similarly, appropriate polyvalent aryl groups as desired may be used in this invention. Representative examples of divalent aryl groups include phenylenes, xylylenes, naphthylenes, biphenylenes, and the like. Alkoxy means straight or branched chain alkoxy having 1 to 20 carbon atoms, and includes, for example, methoxy, ethoxy, n-propoxy, isopropoxy, n-butoxy, isobutoxy, tert-butoxy, pentyloxy, hexyloxy, heptyloxy, octyloxy, nonanyloxy, decanyloxy, 4-methylhexyloxy, 2-propylheptyloxy, and 2-ethyloctyloxy. Aralkyl means aryl groups with attached substituents. The substituents may be any such as alkyl, alkoxy, acyl, etc. Examples of monovalent aralkyl having 7 to 24 carbon atoms include phenylmethyl, phenylethyl, diphenylmethyl, 1,1- or 1,2-diphenylethyl, 1,1-, 1,2-, 2,2-, or 1,3-diphenylpropyl, and the like. Appropriate combinations of substituted aralkyl groups as described herein having desirable valence may be used as a polyvalent aralkyl group.

The novel antireflective composition of the present invention comprises a novel polymer with high carbon content which is capable of crosslinking, such that the coating, formed from the composition after crosslinking, becomes insoluble in the solvent of the material coated above it. The novel coating composition is capable of self-crosslinking or may additionally comprise a crosslinking compound capable of crosslinking with the polymer. The composition may additionally comprise other additives, such as organic acids, esters, thermal acid generators, photoacid generators, surfactants, other high carbon content polymers etc. The composition may comprise additional polymers, especially those with high carbon content. The solid components of the novel composition are dissolved in an organic coating solvent composition, comprising one or more organic solvents. The novel polymer is soluble in the organic coating solvent(s).

The novel polymer of the novel composition comprises at least one repeat unit (A) with a fused aromatic group in the backbone of the polymer, at least one repeat unit (B) with a phenyl moiety in the backbone of the polymer, at least one repeat unit (C) with a hydroxybiphenyl group and at least one repeat unit (D) with 9,9'-bis(hydroxyaryl)fluorene group in the backbone of the polymer. The polymer may be represented by a repeat unit (A) with a fused aromatic ring in its backbone, unit B having the structure (1), unit C having a hydroxylbiphenyl of structure (2) and unit D is a derivatized fluorene of structure (3),

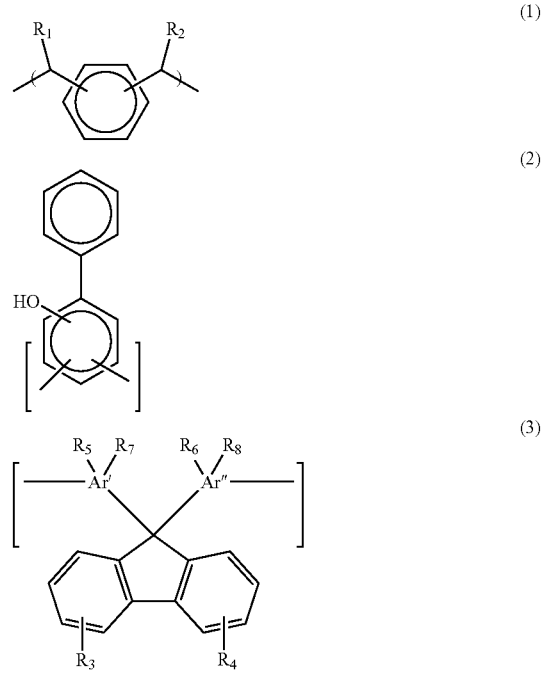

where $R_1$ is $C_1$-$C_4$alkyl; $R_2$ is $C_1$-$C_4$alkyl; $R_3$ and $R_4$ are independently hydrogen or a $C_1$-$C_4$ alkyl; Ar' and Ar" are independently phenylenic or naphthalenic moiety; $R_5$ and $R_6$ are independently —OH or —$(CH_2)_n$—OH where n=2-4; and $R_7$ and $R_8$ are independently hydrogen or $C_1$-$C_4$ alkyl.

This invention also relates to a process for forming an image using the novel antireflective coating composition. The process is especially useful for imaging photoresists using radiation in the deep and extreme ultraviolet (uv) region.

The fused aromatic moiety ring in the polymer backbone (A) may comprise 2 or more aromatic units fused together. More specifically, the fused aromatic moiety may comprise 2-8 aromatic rings or 2-6 aromatic rings or 3-5 aromatic rings or 3-4 aromatic rings. More specifically, the fused aromatic ring may comprise 3 aromatic rings. Most specifically, the fused aromatic ring may be anthracyl. The fused aromatic ring described herein may have the structure (4) or structure (5) which is incorporated within the backbone.

$$[\text{—}Ar'''\text{—}] \tag{4}$$

$$[\text{—}Ar'''\text{—}CH_2\text{—}] \tag{5}$$

The polymer may further comprise an additional unit, E, which is fused aromatic unit of structure (6) attached only through its aromatic moiety to form the backbone of the polymer, $$[\text{—}Ar''''\text{—}]. \tag{6}$$

Ar'''' may comprise 2-8 fused aromatic rings.

The novel polymer may be obtained by a condensation reaction of a monomer (I) comprising a fused aromatic group, a monomer (II) comprising a phenyl moiety with 2 attached vinyl groups, a monomer (III) with a hydroxybiphenyl moiety, and a monomer (IV) comprising a 9,9'-(hydroxyaryl) fluorene derivative, in the presence of an acid catalyst. The reaction may further comprise a fused aromatic compound (V). As an example, the monomer (II) may be divinylbenzene; the compound (I) may be anthracene methanol; the compound (III) may be 2-phenylphenol; the compound (IV) may be 9,9'-bis(hydroxyphenyl)fluorene or 9,9'-bis(6-hydroxynaphthyl)fluorene and, the compound (V) may be naphthalene, anthracene or pyrene. The compound (I) may also be derived from ArCH$_2$X, where Ar is the fused aromatic moiety, and X is a leaving group, such as OH, Cl, I, Br, carboxylate, sulfonate, etc; examples of compound (I) are anthracenemethanol, phenanthrenemethanol, pyrenemethanol, fluoranthenemethanol, coronenemethanol, triphenylenemethanol, anthracene-9-methanol, anthracene methylmethoxy, etc. The fused aromatic ring provides reactive sites which are sites for electrophilic substitution. The biphenyl unit substituted with OH may be chosen from compounds (III) such as 2-phenylphenol, 3-phenylphenol, 4-phenylphenol, 2-(3-hydroxyphenyl)phenol, 2-(2-hydroxyphenyl)phenol and the like such that at least two sites are available for electrophilic attack.

More specific examples of repeat units D which has structure (3) are the following non-limiting examples:

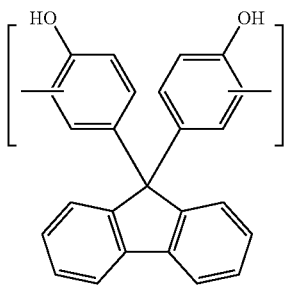

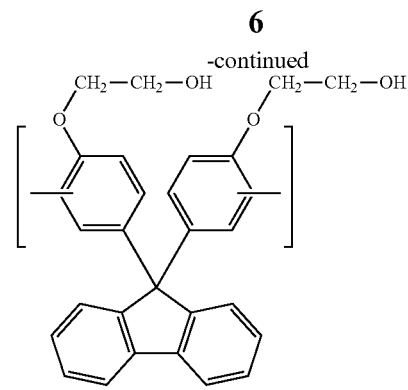

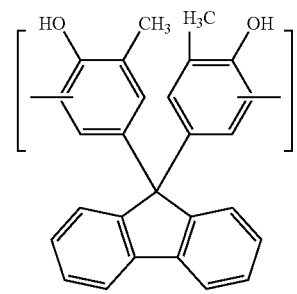

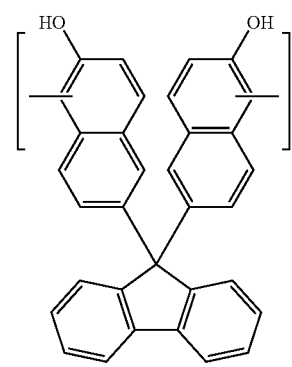

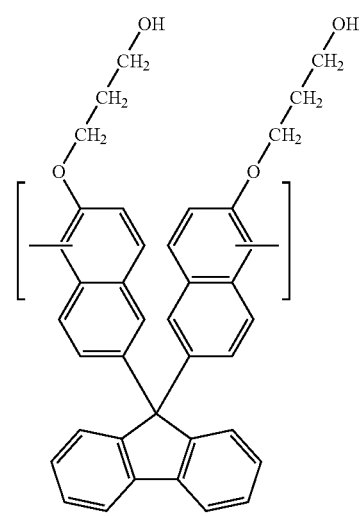

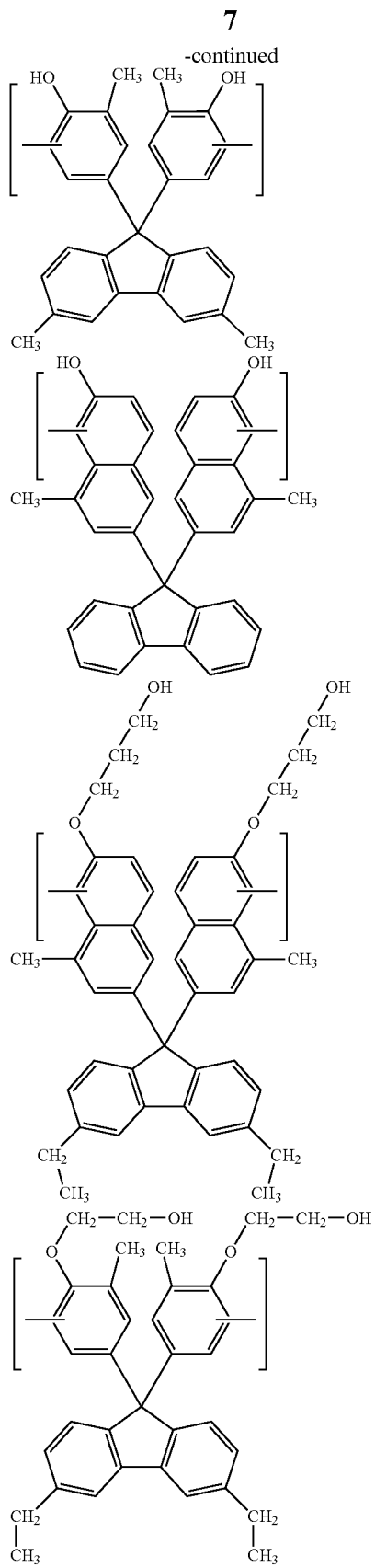
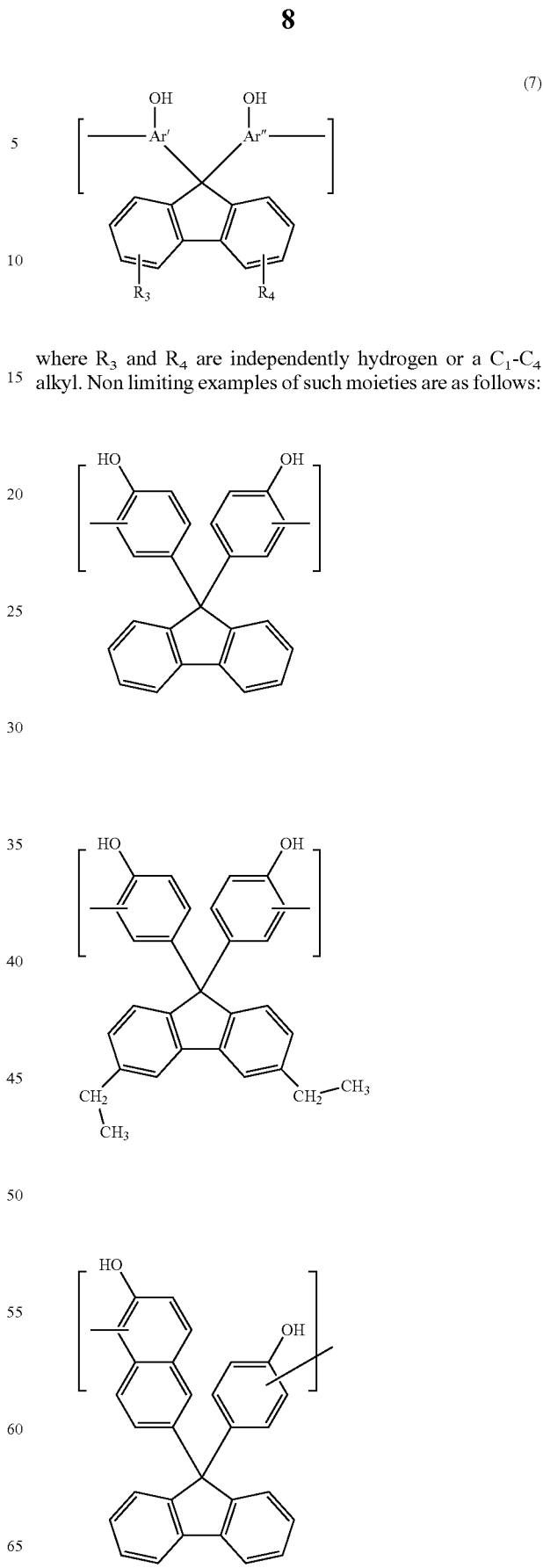
where $R_3$ and $R_4$ are independently hydrogen or a $C_1$-$C_4$ alkyl. Non limiting examples of such moieties are as follows:
More specific examples of the polymer with repeat units D having structure (3) are those 9,9'-bis(hydroxyaryl)fluorenes having the more specific structure (7)

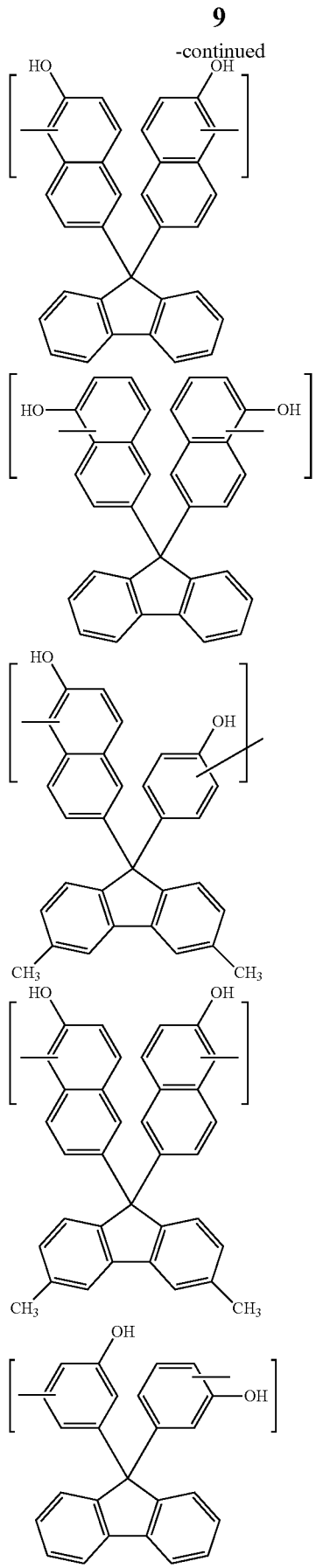
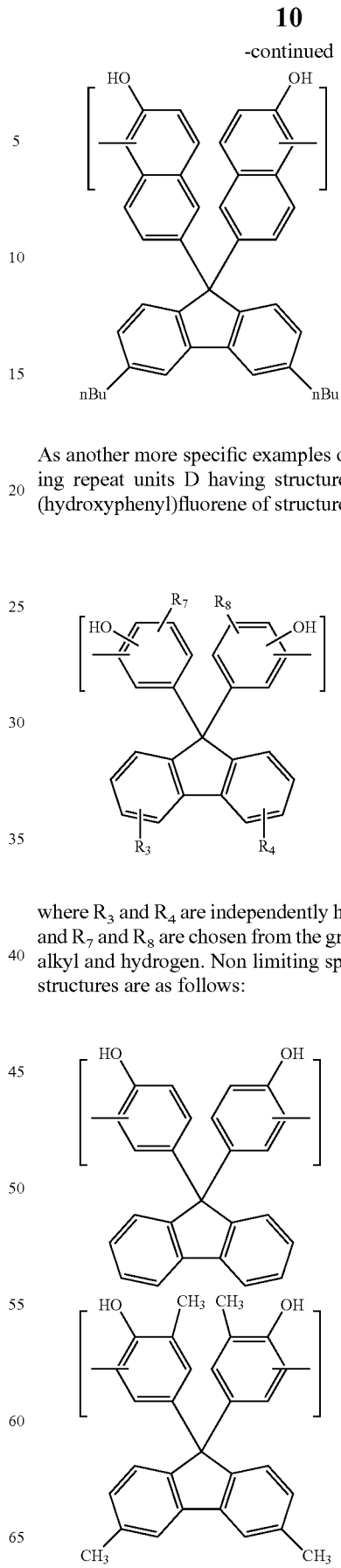
As another more specific examples of the polymer comprising repeat units D having structure (3) are those 9,9'-bis(hydroxyphenyl)fluorene of structure (8)
(8)
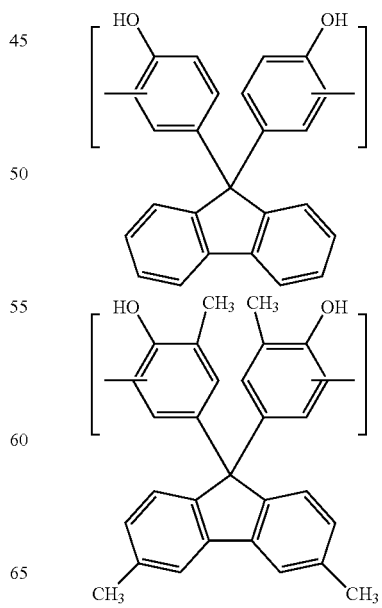
where $R_3$ and $R_4$ are independently hydrogen or $C_1$-$C_4$ alkyl, and $R_7$ and $R_8$ are chosen from the group consisting of $C_1$-$C_4$ alkyl and hydrogen. Non limiting specific examples of such structures are as follows:

-continued
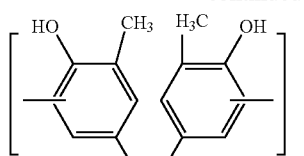
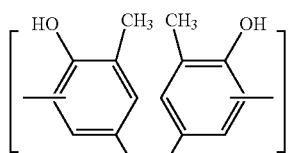
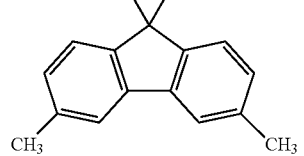
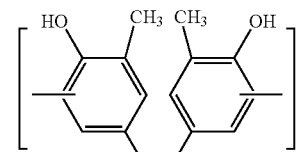
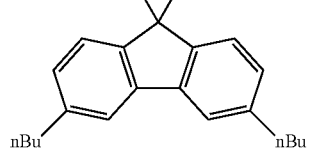
-continued
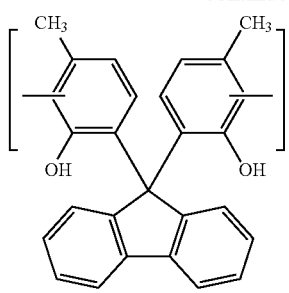
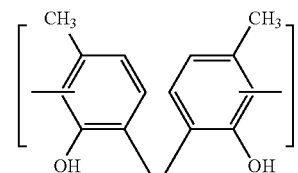
As a specific preferred example the polymer may comprise a repeat unit D having structure (3) which is 9,9'-bis(4-hydroxyphenyl)fluorene of structure (9) as follows:
(9)
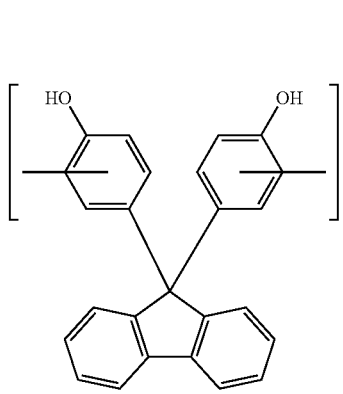
As a specific example of repeat unit A, having structure (4),
$$[\text{---}Ar'''\text{---}]\quad(4)$$
the following non limiting examples are possible:
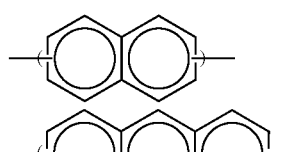
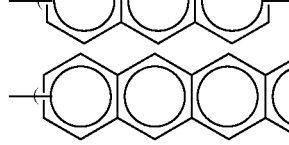

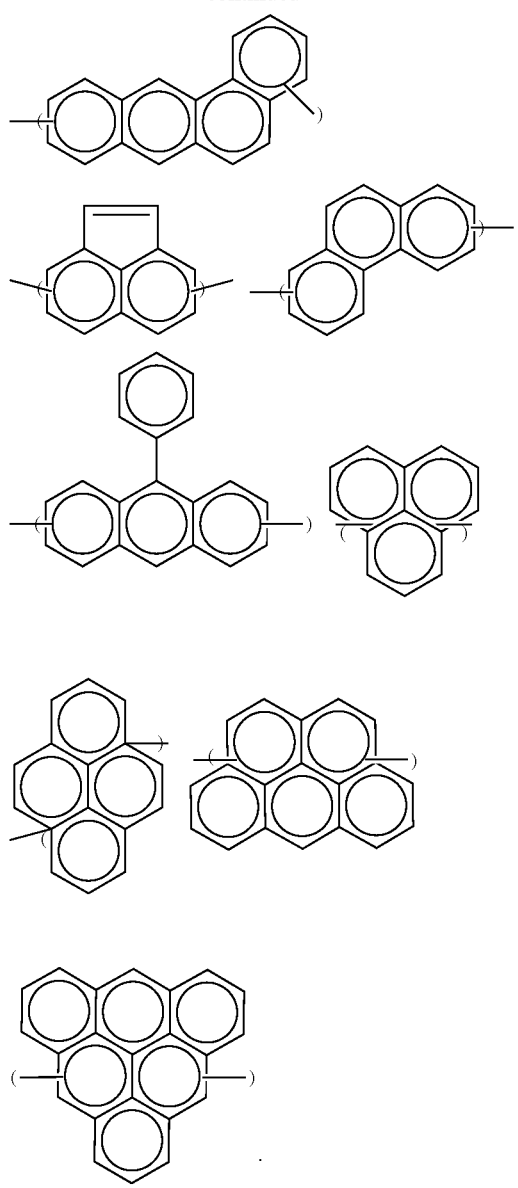
As a specific example of repeat unit A, having structure (5),
$$[\text{—Ar}'''\text{—CH}_2\text{—}]\quad(5)$$
the following non limiting examples are possible:
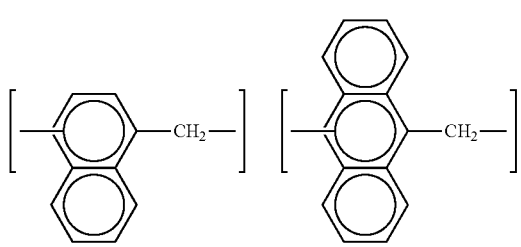
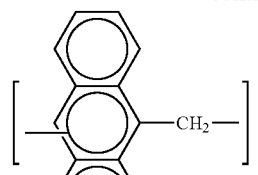
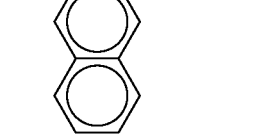
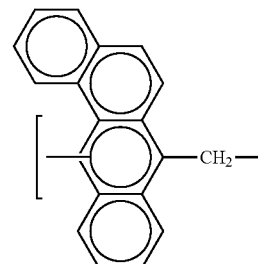
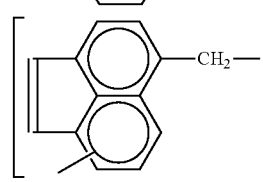
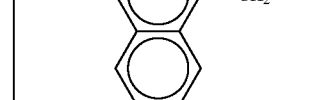
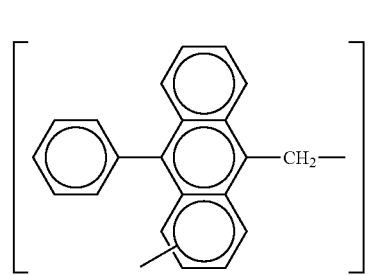
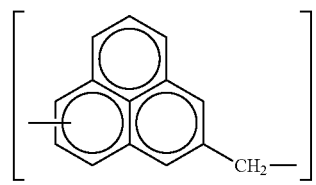
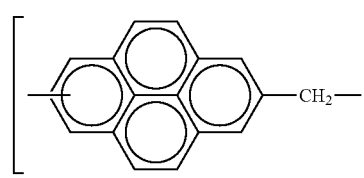

-continued

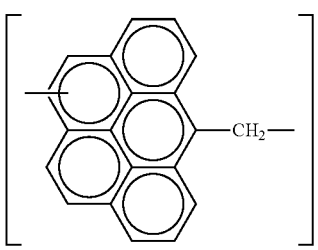

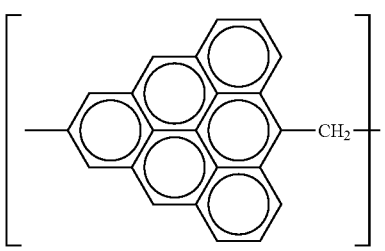

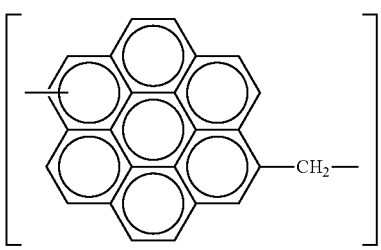

The fused aromatic moiety, Ar'''', of optional repeat unit E in the polymer comprises fused aromatic rings, which are substituted or unsubstituted, but different from unit A. The fused aromatic rings of the polymer can comprise 2 to 8 membered aromatic rings. Examples of the fused aromatic moiety are the following structures.

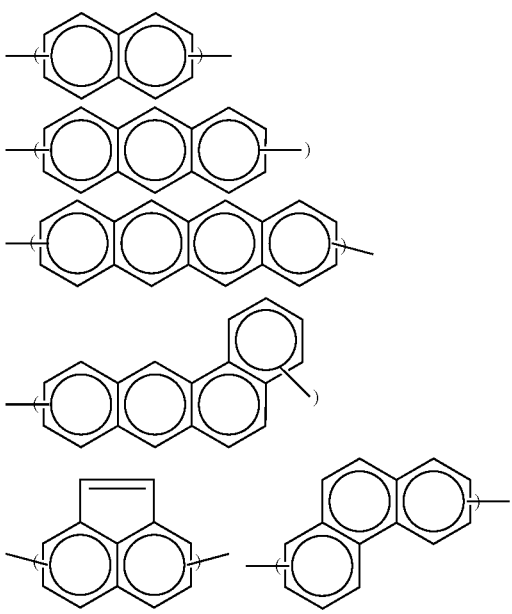

-continued

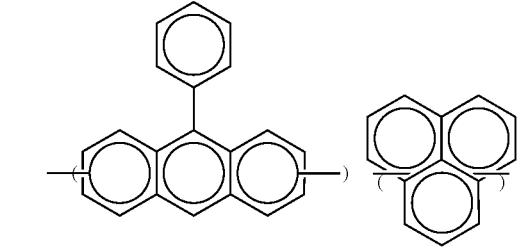

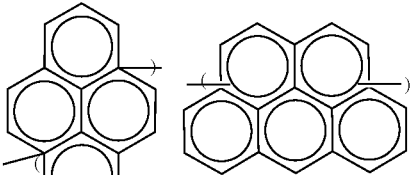

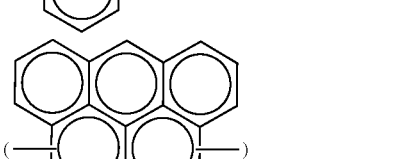

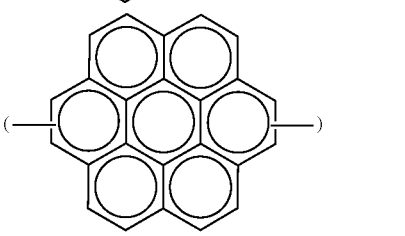

The fused rings may form the backbone of the polymer at any site in the aromatic structure and the attachment sites may vary within the polymer. The fused ring structure can have more than 2 points of attachment forming a branched oligomer or branched polymer. In one embodiment of the polymer, the fused aromatic unit is connected to another aromatic carbon moiety or another fused aromatic unit. In the case of repeat units having general structure (5) which contains a methylene, blocks of fused aromatic units may be formed and the blocks may be separated by a saturated aliphatic carbon unit, such as methylene.

The fused aromatic rings of the polymer may be unsubstituted or substituted with one or more organo constituents, such as alkyl, substituted alkyl, aryl, substituted aryl, alkylaryl, haloalkyl, hydroxyl, amino, aminoalkyl, alkoxy, such as methyl, aminomethyl, bromomethyl, and chloromethyl group. Up to 4 substituents may be present. The substituents on the aromatic rings may aid in the solubility of the polymer in the coating solvent. Some of the substituents on the fused aromatic structure may also be thermolysed during curing, such that they may not remain in the cured coating and thus give a high carbon content film useful during the etching process.

The polymer may comprise more than one type of the fused aromatic structures described herein. In one embodiment the fused aromatic moiety is unsubstituted. In one embodiment the fused aromatic moiety is free of hydroxy or alkoxy groups. In another embodiment the fused aromatic moiety of A and the phenyl group of B is unsubstituted, that is substituted only with hydrogen. In another embodiment A is anthracenemethylene, B is methylenebenzenemethylene and C is a repeat unit derived from hydroxybiphenyl; D is a 9,9'-bis(hydroxyphenyl)fluorene repeat unit, and E when present is a repeat unit derived from naphthalene or anthracene.

The novel polymer may comprise the following units,

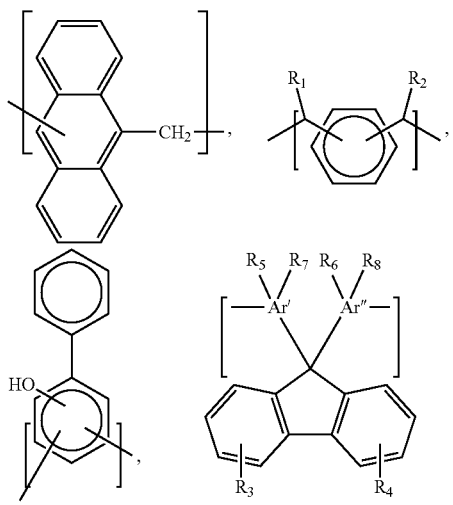

where $R_1$ is $C_1$-$C_4$alkyl, $R_2$ is $C_1$-$C_4$alkyl and $R_5$ to $R_8$ are as described previously. In one embodiment $R_1$ and $R_2$ are methyl. The polymer comprise units, -(A)-, -(B)-, -(C)-, and -(D)- where A is any fused aromatic unit described previously, which may be linear or branched, substituted or unsubstituted, where B is phenyl group which is connected to A, C, or D through a saturated carbon, as shown in structure (1), C is the hydroxybiphenyl unit which is connected to B and/or A through a saturated carbon D is a fluorene derived repeat unit having structure (3) which is connected to B and/or A through its Ar' and Ar''' moieties.

In one embodiment the novel polymer is free of any aliphatic cyclic or polycyclic groups, such as cyclohexyl, adamantyl, norbornyl, etc. In another embodiment the novel polymer is free of any aliphatic cyclic or polycyclic groups, hydroxy or alkoxy group other than the one present in unit C. In one embodiment no polymer in the composition comprises an aliphatic polycyclic group, such as cyclohexyl, adamantyl, norbornyl, etc.

The polymer of the present novel composition may be synthesized by reacting:
a) a fluorene derivative having general structure (10),

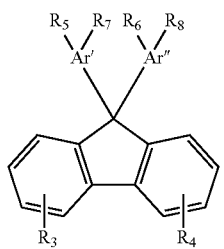

(10)

where $R_3$ and $R_4$ are independently hydrogen or a $C_1$-$C_4$ alkyl, Ar' and Ar'' are chosen independently from phenylenic or naphthalenic groups, $R_5$ and $R_6$ independently from —OH or —(CH$_2$)$_n$—OH where n=2-4 and $R_7$ and $R_8$ independently $C_1$-$C_4$ alkyl or hydrogen, with b) at least one aromatic compound comprising 2 or more fused aromatic rings capable of electrophilic substitution such that the fused rings form the backbone of the polymer, with c) at least one aromatic unit with two active sites which can form carbocations, and with d) at least one hydroxybiphenyl compound, in the presence of an acid catalyst. The aromatic compound may be selected from monomers that provide the desired aromatic unit, more specifically structures shown above or equivalents. Additional fused aromatic monomers may be added to the reactions mixture and may be selected from compounds such as anthracene, phenanthrene, pyrene, fluoranthene, coronene triphenylene, etc. The fused aromatic rings provide at least 2 reactive sites which are sites for electrophilic substitution.

Non limiting examples of monomers having general structure (10) are as follows:

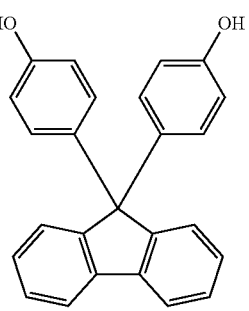

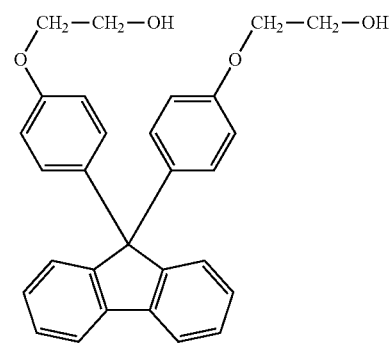

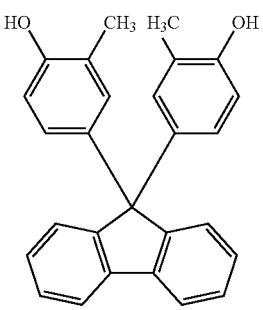

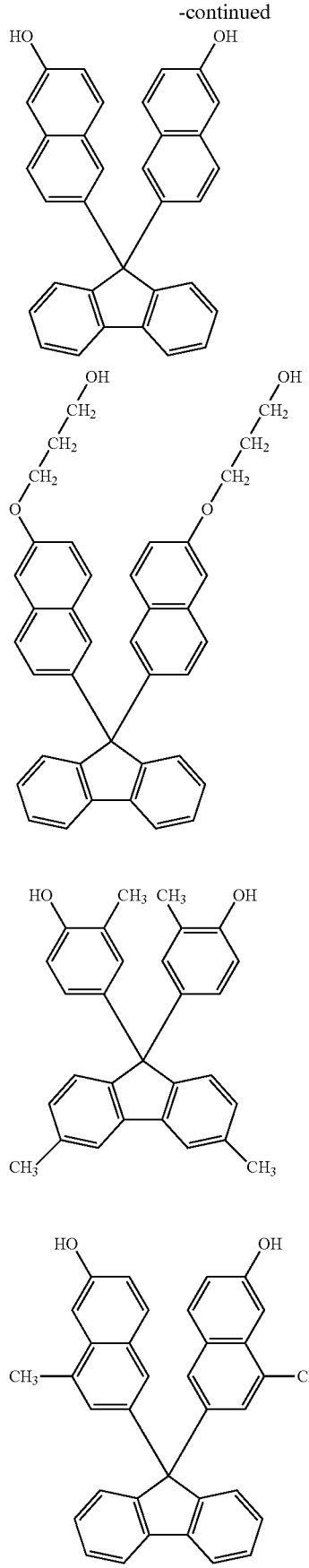

-continued
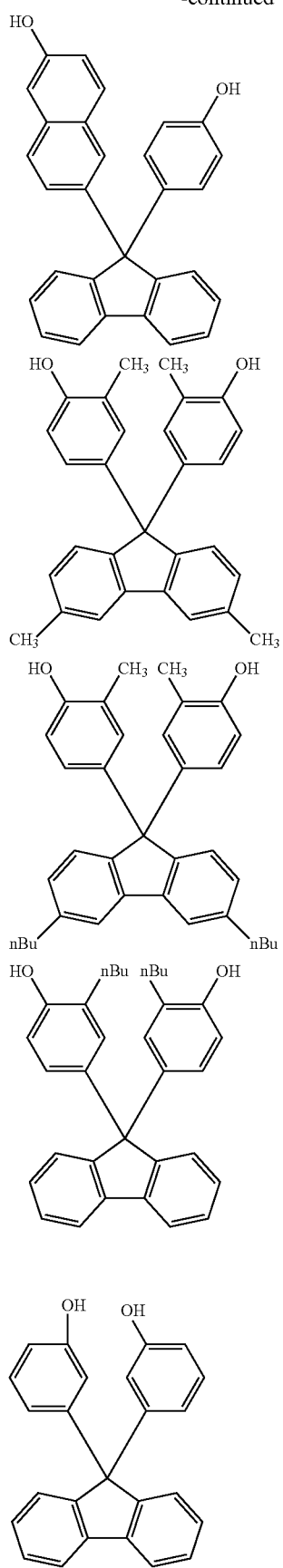
-continued
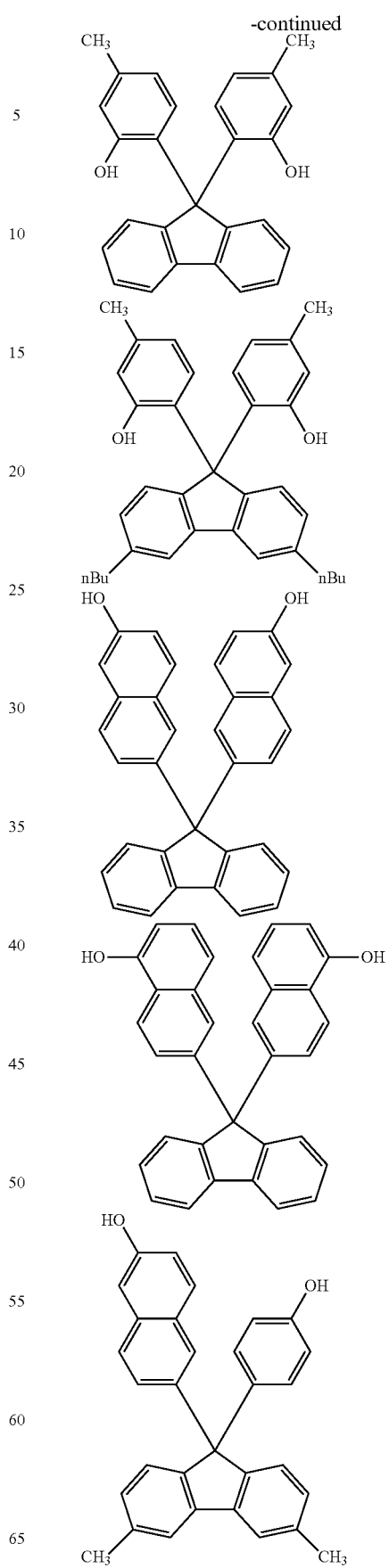

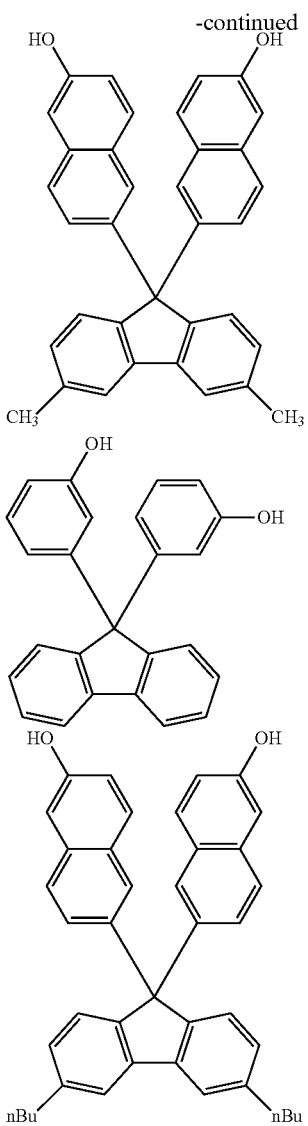

The monomer used to form unit B in the novel polymer comprises a phenyl unit with two reactive sites which are capable of forming carbocations in the presence of an acid, and may be selected from compounds such as divinyl benzene. The monomer used to form unit A which are having structure (5) have general structure (11) where Ar''' is a fused aromatic moiety as previously described and L is a leaving group chosen from OH, $C_1$-$C_4$ alkoxy, $C_1$-$C_4$ carboxylate (e.g. formate, acetate and the like), halide, $C_1$-$C_8$ alkylsulfonate, $C_6$-$C_{20}$ arylsulfonate or a $C_1$-$C_8$ fluoroalkylsulfonate where one reactive site is capable of forming a carbocation in the presence of acid and a fused aromatic ring Ar''' capable of undergoing electronic aromatic substitution is present.

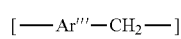 (5)

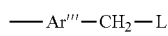 (11)

The polymerization reactions are catalyzed in the presence of a strong acid, such as a sulfonic acid. Any sulfonic acid may be used, examples of which are triflic acid, nonafluorobutane sulfonic acid, bisperfluoroalkylimides, trisperfluoroalkylcarbides, or other strong normucleophilic acids. The reaction may be carried out with or without a solvent. If a solvent is used then any solvent capable of dissolving the solid components may be used, especially one which is nonreactive towards strong acids; solvents such as chloroform, bis(2-methoxyethyl ether), nitrobenzene, methylene chloride, and triglyme, di(ethyleneglycol)dimethylether, di(propyleneglycol)dimethylether, di(propyleneglycol)diethyl ether, propylene glycol monomethy ether acetate (PGMEA), propylene glycol monomethyl ether (PGME) may be used. The reaction may be mixed for a suitable length of time at a suitable temperature, till the polymer is formed. The reaction time may range from about 1 hour to about 14 hours, and the reaction temperature may range from about 50° C. to about 180° C. The polymer is isolated and purified in appropriate solvents, such as methanol, hexane, heptane through precipitation and washing. The novel polymer may be fractionated to obtain a fraction with the desired molecular weight. The polymer is dissolved in a solvent, for example tetrahydrofuran (THF); a nonsolvent is added to the solution such as an alkane; and a precipitate is formed and filtered. The process of fractionation may be carried out at room temperature. The polymer may be further purified. Typically the low molecular weight portion is removed. Previously known techniques of reacting, isolating and purifying the polymer may be used. The weight average molecular weight of the polymer can range from about 1000 to about 5,000, or about 1300 to about 3,000 or about 1,500 to about 2,600.

In the novel polymer the repeat unit A derived from a fused aromatic ring can be between 20 and 60 mole %, repeat unit B can be between 20 and 60 mole %, repeat unit C can be between 5 and 35 mole % and repeat unit D can be between 5 and 35 mole % of the total amount of repeat units. In another embodiment repeat unit A containing a fused aromatic ring can be between 25 and 45 mole %, repeat unit B can be between 25 and 45 mole %, repeat unit C can be between 10 and 30 mole % and repeat unit D can be between 10 and 30 mole % of the total amount of repeat units. In another embodiment repeat unit A containing a fused aromatic ring can be between 25 and 40 mole %, repeat unit B can be between 25 and 40 mole %, repeat unit C can be between 10 and 25 mole % and repeat unit D can be between 10 and 25 mole % of the total amount of repeat units. In the another embodiment repeat unit A containing a fused aromatic ring can be between 30-35 mole %, repeat unit B can be between 30 and 35 mole %, repeat unit C can be between 12 and 18 mole % and repeat unit D can be between 12 and 18 mole % of the total amount of repeat units. In another embodiment repeat unit A containing a fused aromatic ring can be between 30-35 mole %, repeat unit B can be between 30 and 35 mole %, repeat unit C can be between 14 and 17 mole % and repeat unit D can be between 14 and 17 mole % of the total amount of repeat units.

The polymer of the present novel composition may have the structural unit as shown in structure (12), where $R_1$ and $R_2$ are as previously described. In such a polymer the total amount of the repeat unit A and E derived from a fused aromatic ring may be between 20 and 60 mole % of the total units, the optional repeat unit E, if not 0 mole %, can comprise up to 5% of the total amount. If the polymer has no optional repeat unit E (i.e. 0 mole %) then the novel structure may have the structural units as shown in structure (13). Repeat unit B can be between 20 and 60 mole %, repeat unit C can be between 5 and 35 mole %, and repeat unit D may be between 5 and 35 mole % of the total amount of repeat units. In one embodiment repeat unit A and E containing a fused aromatic ring may be between 25 and 45 mole % of the total units, monomer E can comprise up to 5% of the total units. Repeat unit B may be between 25-45 mole %, repeat unit C between 10 and 30 mole %, and repeat unit D between 10 and 30 mole % of the total amount of repeat units. In another embodiment repeat unit A and E containing a fused aromatic ring may be between 25 and 40 mole % of the total units, monomer E can comprise up to 5% of the total units; repeat unit B can be between 25 and 40 mole %, repeat unit C can be between 10 and 25 mole % and repeat unit D can be between 12 and 25 mole % of the total amount of repeat units. In another embodiment repeat unit A and E containing a fused aromatic ring may be between 30 and 35 mole % of the total units, monomer E can comprise up to 5% of the total units, repeat unit B can be between 30 and 35 mole %, repeat unit C can be between 12 and 18 mole % and repeat unit D can be between 12 and 18 mole % of the total amount of repeat units. In another embodiment repeat unit A and E containing a fused aromatic ring may be between 30 and 35 mole % of the total units, monomer E can comprise up to 5% of the total units, repeat unit B can be between 30 and 35 mole %, repeat unit C can be between 14 and 17 mole % and repeat unit D can be between 14 and 17% mole of the total amount of repeat units.

The carbon content of the polymer or the composition is determined by elemental analysis of the solid composition. The carbon content of the composition or polymer can be measured after forming a coating on a substrate and drying the film. The novel polymer of the present invention retains a high carbon content even after a 400° C. bake, that is the carbon content of the polymer or composition after crosslinking is greater than 80 weight % as measured by elemental analysis, or greater than 85 weight %, or greater than weight 90%. Performing an elemental analysis on the solid coating or dry polymer provides the carbon content as weight %. In one embodiment the carbon content of the polymer after crosslinking is in the range 80-95 weight %.

The novel composition of the present invention comprises the polymer and may further comprise a crosslinker. Typically the crosslinker is a compound that can act as an electrophile and can, alone or in the presence of an acid, form a carbocation. Thus compounds containing groups such as alcohol, ether, ester, olefin, methoxymethylamino, methoxymethylphenyl and other molecules containing multiple functional groups, which can form a carbocation are capable of crosslinking with the polymer. Polymeric crosslinkers may be used, such as polymers of glycoluril, melamine, etc., such as those disclosed in U.S. Pat. No. 7,691,556. Examples of compounds which can be crosslinkers are, 1,3 adamantane diol, 1,3,5 adamantane triol, polyfunctional reactive benzylic compounds, tetramethoxymethyl-bisphenol (TMOM-BP) of structure (14), aminoplast crosslinkers, glycolurils, Cymels, Powderlinks, and MX 270 (15).

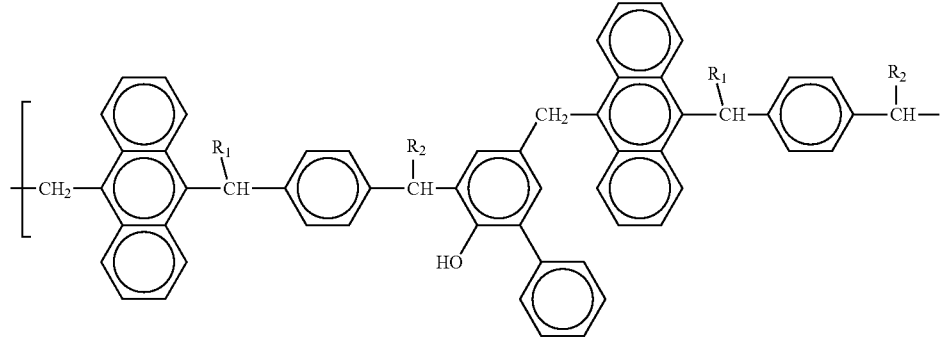

(12)

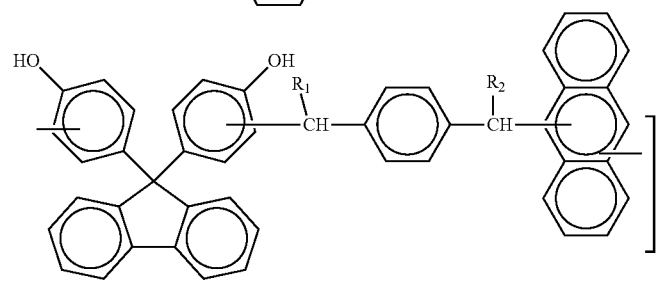

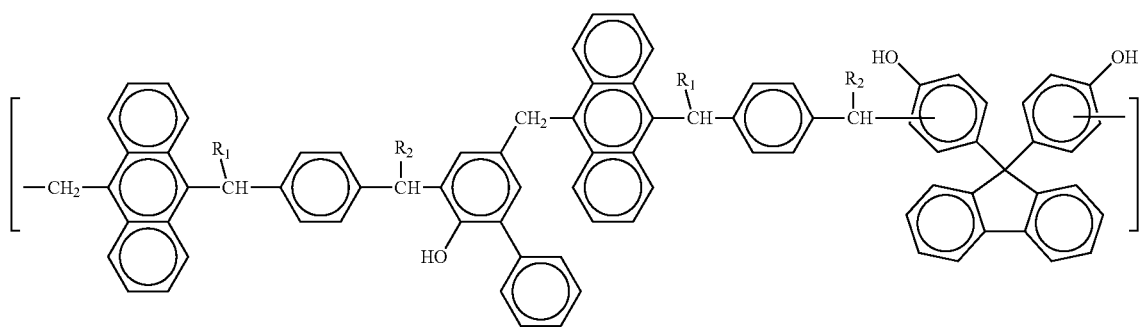

(13)

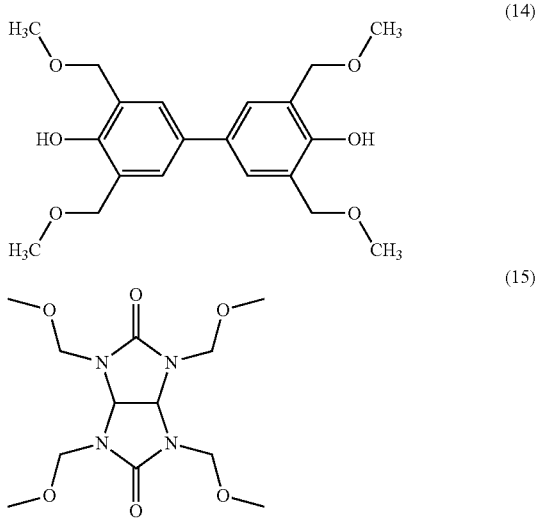

The novel composition comprising the polymer may also comprise an acid generator, and optionally a crosslinker. The acid generator can be a thermal acid generator capable of generating a strong acid upon heating. The thermal acid generator (TAG) used in the present invention may be any one or more that upon heating generates an acid which can react with the polymer and propagate crosslinking of the polymer present in the invention, particularly preferred is a strong acid such as a sulfonic acid. Preferably, the thermal acid generator is activated at above 90° C. and more preferably at above 120° C., and even more preferably at above 150° C. Examples of thermal acid generators are metal-free sulfonium salts and iodonium salts, such as triarylsulfonium, dialkylarylsulfonium, and diarylalkylsulfonium salts of strong non-nucleophilic acids, alkylaryliodonium, diaryliodonium salts of strong non-nucleophilic acids; and ammonium, alkylammonium, dialkylammonium, trialkylammonium, tetraalkylammonium salts of strong non nucleophilic acids. Also, covalent thermal acid generators are also envisaged as useful additives for instance 2-nitrobenzyl esters of alkyl or arylsulfonic acids and other esters of sulfonic acid which thermally decompose to give free sulfonic acids. Examples are diaryliodonium perfluoroalkylsulfonates, diaryliodonium tris(fluoroalkylsulfonyl)methide, diaryliodonium bis(fluoroalkylsulfonyl)methide, diaryliodonium bis(fluoroalkylsulfonyl)imide, diaryliodonium quaternary ammonium perfluoroalkylsulfonate. Examples of labile esters: 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; quaternary ammonium tris(fluoroalkylsulfonyl)methide, and quaternaryalkyl ammonium bis(fluoroalkylsulfonyl)imide, alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA.

The novel composition may further contain at least one of the known photoacid generators, examples of which without limitation, are onium salts, sulfonate compounds, nitrobenzyl esters, triazines, etc. The preferred photoacid generators are onium salts and sulfonate esters of hydroxyimides, specifically diphenyl iodonium salts, triphenyl sulfonium salts, dialkyl iodonium salts, triakylsulfonium salts, and mixtures thereof. These photoacid generators are not necessarily photolysed but are thermally decomposed to form an acid.

The antireflection coating composition of the present invention may contain 70 weight % to about 99 weight % of the novel fused aromatic polymer, or 80 weight % to about 95 weight %, of total solids in the composition. The crosslinker, when used in the composition, may be present at about 1 weight % to about 30 weight % of total solids. The thermal acid generator, may be incorporated in a range from about 0.1 to about 10 weight % by total solids of the antireflective coating composition, or from 0.3 to 5 weight % by solids, and or about 0.5 to 2.5 weight % by solids.

The novel composition may further comprise a second polymer. The second polymer can be one which also has carbon content greater than 75 weight %, or greater than 80 weight %. The second polymer may comprise a unit containing a fused aromatic ring, A, as described herein, a phenyl moiety, B, and a third unit selected from a substituted fused aromatic ring with greater than 2 aromatic rings. The third unit may be selected from a fused aromatic substituted with a hydroxy group. The third unit may be selected from hydroxyanthracyl moiety, hydroxyphenyl moiety, hydroxynaphthyl moiety, hydroxy pyrenyl moiety, $C_1$-$C_4$ alkoxy anthracyl moiety, $C_1$-$C_4$ alkyl phenyl moiety, $C_1$-$C_4$ alkyl naphthyl moiety, $C_1$-$C_4$ alkyl pyrenyl moiety, etc. The third unit may be selected from hydroxyphenyl, hydroxynaphthyl, hydroxyphenanthryl, hydroxyanthracyl, etc. The third unit may be hydroxynaphthyl group. The second polymer may be added to the composition ranging from 1 weight % to 20% by weight of the total polymer concentration in the composition, or 1% to 10% by weight of the total polymer concentration. In one embodiment the second polymer is free of any aliphatic cyclic polycyclic groups. In another embodiment the second polymer is free of any aliphatic cyclic polycyclic groups and the third unit is a hydroxynaphthyl group.

In one embodiment the novel composition comprises the novel polymer, a second polymer described herein, a crosslinker, a thermal acid generator, optional surfactant and solvent(s). Another embodiment of the novel composition comprises the novel polymer, a crosslinker, a thermal acid generator, optional surfactant and solvent(s).

The solid components of the antireflection coating composition are mixed with a solvent or mixtures of solvents that dissolve the solid components of the antireflective coating. Suitable solvents for the antireflective coating composition may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

The antireflective coating composition may comprise other components to enhance the performance of the coating, e.g. monomeric dyes, lower alcohols ($C_1$-$C_6$ alcohols), surface leveling agents, adhesion promoters, antifoaming agents, etc.

Since the antireflective film is coated on top of the substrate and is also subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The refractive indices of the polymer or composition, n (refractive index) and k (extinction coefficient) can range from about 1.3 to about 2.0 for the refractive index and about 0.04 to about 1.0 for the extinction coefficient at the exposure wavelength used, such as 193 nm, where these parameters which relate to the complex refractive index $n_c$, are defined as follows, $$n_c = n - jk$$

(Handbook of Semiconductor Manufacturing Technology Edited by Yoshio Nishi et al, Marcel Dekker Inc, 2000 page 205). The values of n and k can be obtained from an ellipsometer.

The extinction coefficient (k) values of the novel composition ranges from about 0.05 to about 1.0, preferably from about 0.1 to about 0.8 at the exposure wavelength, as derived from ellipsometric measurements. In one embodiment the composition has a k value in the range of about 0.2 to about 0.5 at the exposure wavelength. The refractive index (n) of the antireflective coating is also optimized and can range from about 1.3 to about 2.0, preferably 1.5 to about 1.8. The n and k values for the polymer or the composition can be calculated using an ellipsometer, such as the J. A. Woollam WVASE VU-32™ Ellipsometer. The exact values of the optimum ranges for k and n are dependent on the exposure wavelength used and the type of application. Typically for 193 nm the preferred range for k is about 0.05 to about 0.75, and for 248 nm the preferred range for k is about 0.15 to about 0.8.

The antireflective coating composition is coated on the substrate using techniques well known to those skilled in the art, such as dipping, spin coating or spraying. The film thickness of the antireflective coating ranges from about 50 nm to about 2000 nm. The coating is further heated on a hot plate or convection oven for a sufficient length of time to remove any residual solvent and induce crosslinking, and thus insolubilizing the antireflective coating to prevent intermixing between the antireflective coating and the layer to be coated above it. The preferred range of temperature is from about 90° C. to about 280° C.

Other types of antireflective coatings may be coated above the coating of the present invention. Typically, an antireflective coating which has a high resistance to oxygen etching, such as one comprising silicon groups, such as siloxane, functionalized siloxanes, silsesquioxanes, or other moieties that reduce the rate of etching, etc., is used so that the coating can act as a hard mask for pattern transference. The silicon coating composition can be spin coatable or chemical vapor deposited. In one embodiment the substrate is coated with a first film of the novel composition of the present invention and a second coating of another antireflective coating comprising silicon is coated above the first film. The second coating can have an extinction coefficient (k) value in the range of about 0.05 and 0.5. A film of photoresist is then coated over the second coating. The imaging process is exemplified in FIG. 1.

A film of photoresist is coated on top of the uppermost antireflective coating and baked to substantially remove the photoresist solvent. An edge bead remover may be applied after the coating steps to clean the edges of the substrate using processes well known in the art.

The substrates over which the antireflective coatings are formed can be any of those typically used in the semiconductor industry. Suitable substrates include, without limitation, low dielectric constant materials, silicon, silicon substrate coated with a metal surface, copper coated silicon wafer, copper, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may comprise any number of layers made from the materials described above.

Photoresists can be any of the types used in the semiconductor industry, provided the photoactive compound in the photoresist and the antireflective coating substantially absorb at the exposure wavelength used for the imaging process. The photoresist is imageable with radiation from about 240 nm to about 12 nm.

To date, there are several major deep ultraviolet (uv) exposure technologies that have provided significant advancement in miniaturization, and these radiation of 248 nm, 193 nm, 157 and 13.5 nm. Photoresists for 248 nm have typically been based on substituted polyhydroxystyrene and its copolymers/onium salts, such as those described in U.S. Pat. No. 4,491,628 and U.S. Pat. No. 5,350,660. On the other hand, photoresists for exposure at 193 nm and 157 nm require non-aromatic polymers since aromatics are opaque at this wavelength. U.S. Pat. No. 5,843,624 and U.S. Pat. No. 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. No. 6,447,980 and U.S. Pat. No. 6,723,488, and incorporated herein by reference. Photoresists sensitive at 157 nm, and based on fluorinated polymers are known to be substantially transparent at that wavelength and are described in U.S. Pat. No. 6,790,587, U.S. Pat. No. 6,849,377, U.S. Pat. No. 6,818,258, and U.S. Pat. No. 6,916,590. Photoresists that absorb extreme ultraviolet radiation (EUV) of 13.5 nm are also useful and are known in the art. The novel coatings can also be used in nanoimprinting and e-beam lithography.

After the coating process, the photoresist is imagewise exposed with a mask. The exposure may be done using typical exposure equipment. Examples of exposure wavelength sources are 248 nm, 193 nm and extreme ultraviolet, although any source may be used. The exposed photoresist is then developed in an aqueous developer to remove the treated photoresist. The developer is preferably an aqueous alkaline solution comprising, for example, tetramethyl ammonium hydroxide (TMAH). Example of a developer is 0.26N aqueous tetramethyl ammonium hydroxide (TMAH) solution. The developer may further comprise surfactant(s). An optional heating step can be incorporated into the process prior to development and after exposure. The photoresist may be imaged by ebeam to form a pattern or a pattern may be imprinted.

The process of coating and imaging photoresists is well known to those skilled in the art and is optimized for the specific type of photoresist used. The patterned substrate can then be dry etched with an etching gas or mixture of gases, in a suitable etch chamber to remove the exposed portions of the antireflective film or multiple layers of antireflective coatings, with the remaining photoresist acting as an etch mask. Various etching gases are known in the art for etching organic antireflective coatings, such as those comprising $O_2$, $CF_4$, $CHF_3$, $Cl_2$, HBr, $SO_2$, CO, etc.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the extinction coefficient (k) values of the carbon hard mask antireflective coating in the Examples below were measured on a J. A. Woollam VASE32 ellipsometer.

The molecular weight of the polymers was measured on a Gel Permeation Chromatograph using a Water 2695 Alliance Separation Module, or equivalent equipped with a Waters Dual Wavelength UV Detector, Model 2487, or equivalent and a Waters Differential Refractometer, Model 2414, Dectector equivalent, a Shodex Columns set as follows: one Shodex GPC KF-801 ($1.5\times10^3$) column, Two Shodex GPC KF-802 ($5\times10^3$) columns and one Shodex GPC KF-804 ($4\times10^5$) column. The mobile phase was UV stabilized THF HPLC grade and the molecular weight standard was as set of polystyrene standards supplied by American Standards Corporation and Millipore Corporation or equivalent.

Solubility measurements of polymers in PGMEA and TGA measurement were made as described in the Examples.

Chemicals:

9-anthracenemethanol, divinylbenzene, and 2-phenylphenol were obtained from the Sigma-Aldrich Co, 9,9'-bis(4-hydroxyphenyl)fluorene was obtained from TCI America. Tetrakis(methoxymethyl)-[(1,1'-biphenyl)-4,4'-diol was obtained from Honshu Chem Inc Japan. The dodecylbenzenesulphonic acid salt with triethyl amine was obtained from the Sigma-Aldrich-Co. All other chemicals unless otherwise noted were obtained from the Sigma-Aldrich Co.

Example 1

Synthesis of Carbon Hard Mask Polymer

A solution was prepared consisting of 42.5 g (0.25 mol) 2-phenylphenol, 104.1 g (0.5 mol) 9-Anthracenemethanol, 65.1 g (0.5 mol) divinylbenzene, and 85.6 g (0.25 mol) of 9,9-bis(4-hydroxyphenyl)fluorene dissolved in 200 g cyclopentyl methyl ether (CPME) and 700 g diethylene glycol dimethyl ether (DEGME) and the mixture was stirred for 10 minutes in a 3 Liter, 4 neck flask equipped with an overhead mechanical stirrer, condenser, thermo watch, Dean Stark trap and a nitrogen purge. After this time, 4.5 g of triflic acid (1.5% wt of monomers) was added to the stirred mixture and it was stirred for another 10 minutes. The temperature of the stirred mixture was then raised to 140° C. and heated for 3 hours. After cooling the reaction mixture and diluting it with 400 mL of CPME, it was transferred to a separating funnel, and washed with two aliquots of deionized (DI) water (2×400 mL), and was precipitated by drowning into hexane. The polymer was filtered, washed and dried under vacuum. The polymer was dissolved in THF again and isolated using hexane one more time to remove all monomer and oligomers. The weight average molecular weight of the polymer was 1918 and polydispersity (PD) of 1.78. Elemental analysis gave Carbon 88.99% and Hydrogen 5.89%.

Examples 2-10

Synthesis of Carbon Hard Mask Polymer

Example 1 was repeated and polymers were made, data are shown in Table-1

TABLE 1

| Examples | Mw | Pd | % C | % H |
|---|---|---|---|---|
| 2 | 2010 | 1.86 | 88.93 | 5.58 |
| 3 | 2117 | 1.73 | 88.10 | 6.35 |
| 4 | 2086 | 1.60 | 88.52 | 6.05 |
| 5 | 2151 | 1.66 | 88.32 | 5.61 |
| 6 | 2227 | 1.66 | 88.31 | 5.63 |
| 7 | 2016 | 1.72 | 88.30 | 6.16 |
| 8 | 2147 | 1.71 | 88.66 | 5.86 |
| 9 | 2132 | 1.68 | 88.71 | 5.73 |
| 10 | 2187 | 1.68 | 88.56 | 6.11 |

Comparative Synthetic Example 1

Synthesis of polymer of 2-pheny/phenol/divinylbenzene/9-anthracenemethanol

A solution was prepared consisting of 12.76 g (0.075 mol) 2-phenylphenol, 15.62 g (0.075 mol) 9-Anthracene Methanol, 9.76 (0.075 mol) divinylbenzene dissolved in 25 g cyclopepentyl methyl ether (CPME) and 90 g diethylelene glycol dimethyl ether (DEGME) and the mixture was stirred for 5 minutes in a 250 mL, 4 neck flask equipped with an overhead mechanical stirrer, condenser, thermo watch, Dean Stark trap and a nitrogen purge. After this time, 1.14 g of triflic acid was added to the stirred mixture and it was stirred for another 10 minutes. The temperature of the stirred mixture was then raised to 140° C. and heated for 3 hours. After cooling the reaction mixture and diluting it with 250 mL of CPME, it was transferred to a separating funnel, and washed with two aliquots of deionized (DI) water (2×200 mL). The polymer was precipitated by drowning into hexane and was filtered, washed and dried under vacuum. The polymer was dissolved in THF and isolated using hexane to remove all monomer and oligomers. The weight average molecular weight of the polymer was 1859, PD was 1.40.

Comparative Synthetic Example 2

Synthesis example 1 was repeated using bismethoxymethyl benzene instead of divinylbenzene and a polymer was obtained with Mw-1998; PD-2.16. This polymer was found to be insoluble in PGMEA, PGME/PGMEA-70/30, and PGME.

Process Example 1

The polymer from example 1 dissolved in PGMEA at 15% solid, and also it also dissolved in PGME/PGMEA (70/30) and in PGME at 15% solid.

The polymer from comparative example 1 dissolved in PGMEA at 15% solid, however, it did not dissolve in PGME/PGMEA (70/30) and PGME at 15% solid. This shows the improved solubility of the polymers of this invention containing fluorene based repeat units which impart superior solubility in a wider range of solvent compared to a similar polymer not containing such as unit.

Process Example 2

The TGA analysis in a Perkin Elmer TGA of the polymer from example 1, in air from 30° C. to 400° C., at 20° C./min gives a −14.325% weight loss.

The same analysis done of the polymer from comparative example 1, gave a comparable weight loss of −13.039%, showing that the polymers of this invention containing fluorene based repeat units have comparable thermal stability to polymers not containing such units.

Process Example 3

A solution was prepared consisting of the polymer from Example 1 (8.9123 g), 3,3',5,5'-tetrakis(methoxymethyl)-[(1,1'-biphenyl)-4,4'-diol] (0.8912 g), a 10 wt % solution of triethylammonium dodecylbenzenesulfonate in PGMEA (3.5649 g) mixed with 50.1316 g of PGMEA. After complete mixing the solution was filtered through a 0.02 μm filter.

Process Example 4

This filtered solution from Example 3 was spin-coated on an 8" silicon wafer at 1500 rpm. The coated wafer was baked on a hotplate at 230° C. for 60 seconds. The thin coated material was scraped out from the wafer surface by a blade and elemental analysis was done. The results are shown in the Table 1. Another silicon wafer was spin-coated with the filtered solution from Example 3 at 1500 rpm and the coated wafer was baked at 400° C. for 120 seconds. The baked material was scraped out from the wafer surface by a blade and elemental analysis was done. The results are shown in the Table 2.

TABLE 2

| Composition from Example 2 | C (%) | H (%) | O (%) |
|---|---|---|---|
| Bake at 230° C. for 60 seconds | 87.69 | 5.96 | 6.35 |
| Bake at 400° C. for 120 seconds | 80.86 | 2.72 | 16.42 |

Process Example 5

A solution was prepared consisting of the polymer from Example 1 (2.6316 g), 3,3',5,5'-tetrakis(methoxymethyl)-[(1,1'-biphenyl)-4,4'-diol] (0.2632 g), a 10 wt % solution of triethylammonium dodecylbenzenesulfonate in PGMEA (1.0536 g) mixed with 26.0526 g of PGMEA. After complete mixing the solution was filtered through a 0.02 μm filter.

Process Example 6

Via Filling

Using an ISA Optitrack coat/bake/chill processing system, a formulation from process example 5 was coated onto a 6" silicon wafer adjusting the rpm in order to achieve the target film thickness of 250 nm (Nanospec 8000 from Nanometric) after a post applied bake at 240° C. for 60 seconds.

Then the silicon wafer chips into which 100 nm, 90 nm, 80 nm, 75 nm (1:1) (1:1.5) and (1:10) vias have been etched to a depth of 600 nm were glued to a bare silicon wafer and this assembly were coated with the formulation. The wafer chips were removed from the silicon wafer, their back sides cleaned with acetone and then baked at 240° C./60 seconds on Optitrack. The wafers were submitted for SEM evaluation.

SEM cross-section obtained for this formulation showed that for 1:1 vias (100 nm; 90 nm; 80 nm; 75 nm) good via filling was obtained with no visible pinholes, voids or other defects. The following less dense pitches also gave very good via filling with no visible pinholes, voids or other defects: 100 nm, 90 nm, 80 nm and 75 nm pitch (1000 nm); pitch (250 nm); pitch (200 nm); pitch (180 nm); pitch (160 nm); pitch (150 nm). The 6" silicon wafers coated with the formulation showed no visible pinholes, voids or other defects.

Comparative Process Example 1

Using polymer from Comparative Synthetic Example 1 a similar formulation as in Process example 5 was made.

Comparative Process Example 2

Via Filling

Using an ISA Optitrack coat/bake/chill processing system, a formulation from comparative process example 1 was coated onto a 6" silicon wafer adjusting the rpm in order to achieve the target film thickness of 250 nm (Nanospec 8000 from Nanometric) after a post applied bake at 240° C. for 60 seconds.

Then the silicon wafer chips into which 100 nm, 90 nm, 80 nm, 75 nm (1:1) (1:1.5) and (1:10) vias have been etched to a depth of 600 nm were glued to a bare silicon wafer and this assemble were coated with the formulation. The wafer chips were removed from the silicon wafer, their back sides cleaned with acetone and then baked at 240° C./60 seconds on Optitrack. The wafers were submitted for SEM evaluation.

SEM cross-section obtained for this formulation showed that for 1:1 vias (100 nm; 90 nm; 80 nm; 75 nm) good via filling was obtained with no visible pinholes, voids or other defects. The following less dense pitches also gave very good via filling with no visible pinholes, voids or other defects: 100 nm, 90 nm, 80 nm and 75 nm pitch (1000 nm); pitch (250 nm); pitch (200 nm); pitch (180 nm); pitch (160 nm); pitch (150 nm). The 6" silicon wafers coated with the formulation showed no visible pinholes, voids or other defects. Similar results were obtained as in Process Example 6.

Process Example 7

Coating Uniformity

Using Tokyo Electron Cleantrak Act 12, the underlayer solution from process example 5 was coated on a silicon wafer with 12 inch diameter and heated on a hotplate at 400° C. for 60 seconds. The film thickness was measured by Nanospec 8000.

The coating uniformity was good and measured film thickness was 432.3 nm±5.1 nm.

Process Example 8

Coating Uniformity

Using Tokyo Electron Cleantrak Act 12, the underlayer solution from process example 5 was coated on a silicon wafer with 12 inch diameter and heated on a hotplate at 400° C. for 60 seconds.

In this example, the wafer was prewet with PGME/PGMEA 70/30 (wt/wt) before dispensing the underlayer solution. The film thickness was measured by Nanospec 8000.

The coating uniformity was good and measured film thickness was 458.9 nm±2.65 nm Comparative Process Example 3

Coating Uniformity

Using Tokyo Electron Cleantrak Act 12, the underlayer solution from Comparative Process Example 1 was coated on a silicon wafer with 12 inch diameter and heated on a hotplate at 400° C. for 60 seconds. The film thickness was measure by Nanospec 8000. The coating uniformity was worse than example 7 and film thickness was 404.6 nm±8.15 nm.

Comparative Process Example 4

Coating Uniformity

Using Tokyo Electron Cleantrak Act 12, the underlayer solution from Comparative Process Example 1 was coated on a silicon wafer with 12 inch diameter and heated on a hotplate at 400° C. for 60 seconds.

In this example, the wafer was prewet with PGME/PGMEA 70/30 (wt/wt) before dispensing the underlayer solution.

The film thickness was measure by Nanospec 8000. The coating uniformity was worse than example 8 and film thickness was 437.1 nm±7.45 nm.

Process Example 9

A solution was prepared as in process example 5. After complete mixing the formulation was filtered through a 0.02 μm filter and the solution was spin-coated on the 8" silicon wafer at 1500 rpm and baked at 275° C. for 60 seconds. The refractive index (n) at 193 nm was 1.45 and the extinction coefficient (k) at 193 nm was 0.65 of the antireflective coating as measured on a J. A. Woollam VASE32 ellipsometer.

Process Example 10

Etching Rate

An underlayer solution was prepared consisting of the polymer from Example 1 (10.5 g), 1,3,4,6-Tetrakis(methoxymethyl)glycoluri (1.05 g), a 10 wt % solution of triethylammonium dodecylbenzenesulfonate in PGMEA (4.21 g) mixed with 26.0526 g of PGMEA. After complete mixing the solution was filtered through a 0.02 μm filter.

Using Tokyo Electron Cleantrak Act 12, this underlayer solution was coated on a silicon wafer with 12 inch diameter and heated on a hotplate at 400° C. for 60 seconds.

The wafer was dry etched with $CF_4$ gas and the etching rate was measured by film thickness change before and after the etching. The etching rate was 84.7 nm/min.

Process Example 11

Etching Rate

Using Tokyo Electron Cleantrak Act 12, the underlayer solution from process example 5 was coated on a silicon wafer with 12 inch diameter and heated on a hotplate at 400° C. for 60 seconds.

The wafer was dry etched with $CF_4$ gas and the etching rate was measured by film thickness change before and after the etching. The etching rate was 86.5 nm/min.

Summary of Examples

The results in the preceding examples demonstrate that the solubility of polymer of present invention was improved and consequently the coating uniformity of the formulation of the present invention was also improved, while maintaining the following desirable properties, such as TGA weight loss of polymer of new invention, via filling, etch rate, refractive index (n) at 193 nm, and extinction coefficient (k) at 193 nm.

The invention claimed is:

1. An antireflective coating composition comprising a polymer capable of being crosslinked, where the polymer comprises at least one repeat unit (A) comprising a fused aromatic unit in the polymer backbone, at least one repeat unit (B) having a structure (1), at least one repeat unit (C) comprising hydroxybiphenyl repeat unit of structure (2), and at least one repeat unit (D) comprising a fluorene repeat unit of structure (3),

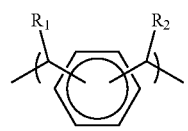
(1)

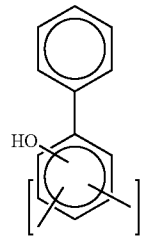
(2)

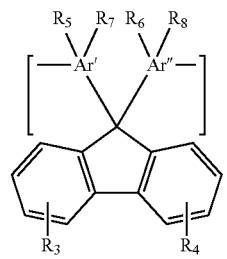
(3)

where $R_1$ is $C_1$-$C_4$ alkyl, $R_2$ is $C_1$-$C_4$ alkyl, $R_3$ and $R_4$ are independently hydrogen or a $C_1$-$C_4$ alkyl, Ar' and Ar" are independently phenylenic or naphthalenic group, $R_5$ and $R_6$ are independently —OH or —$(CH_2)_n$—OH where n=2-4, and $R_7$ and $R_8$ are independently hydrogen or $C_1$-$C_4$ alkyl; and, a solvent.

2. The composition of claim 1, where the repeat unit A has the structure (4)

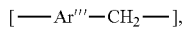
(4)

where Ar' is a fused aromatic ring containing 2-8 aromatic rings.

3. The composition of claim 1 where the repeat unit A is

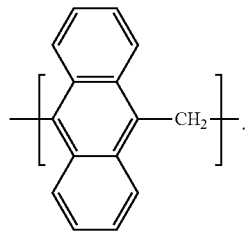

4. The composition of claim 1, where the polymer in the composition is free of aliphatic polycyclic moieties.

5. The composition of claim 1, where the polymer further comprises unit (6),

(6)

where Ar' is a fused aromatic ring containing 2-8 aromatic rings.

6. The composition of claim 1, where $R_1$ is methyl and $R_2$ is methyl.

7. The composition of claim 1, where the fused aromatic ring has 2 to 5 aromatic rings.

8. The composition of claim 1, where the fused aromatic ring has 3 or 4 aromatic rings.

9. The composition of claim 1, where the composition further comprises an acid generator.

10. The composition of claim 1 where D is a 9,9'-bis(hydroxyaryl)fluorene of structure (7)

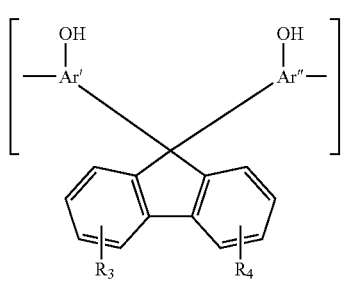
(7)

where $R_3$ and $R_4$ are independently hydrogen or a $C_1$-$C_4$ alkyl.

11. The composition of claim 1 where D is a 9,9'-bis(hydroxyphenyl)fluorene of structure (8)

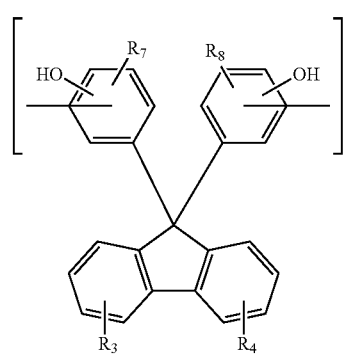
(8)

where $R_3$ and $R_4$ are independently hydrogen or $C_1$-$C_4$ alkyl, and $R_7$ and $R_8$ are independently hydrogen or $C_1$-$C_4$ alkyl.

12. The composition of claim 1 where D is 9,9'-bis(4-hydroxyphenyl)fluorene of structure (9)

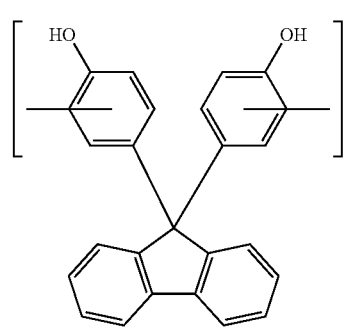
(9)

13. The composition of claim 1, where the composition further comprises a thermal acid generator.

14. The composition of claim 1 further comprising a second polymer.

15. The composition of claim 1 further comprising a crosslinker.

16. The composition of claim 1 further comprising a crosslinker comprising multiple functional groups selected from the group consisting of esters, ethers, alcohols olefins, methoxymethylamino, and methoxymethylphenyl.

17. The composition of claim 1 further comprising a crosslinker selected from a group consisting of 1,3-adamantane diol, 1,3,5-adamantane triol, polyfunctional reactive benzylic compounds, aminoplast crosslinkers, glycourils and powderlinks.

18. A process for manufacturing a microelectronic device, comprising;
 a) providing a substrate with a first layer of an antireflective coating composition from claim 1;
 b) optionally, providing at least a second antireflective coating layer over the first antireflective coating composition layer;
 b) coating a photoresist layer above the antireflective coating layers;
 c) imagewise exposing the photoresist layer with radiation;
 d) developing the photoresist layer with an aqueous alkaline developing solution.

19. The process of claim 18, where the photoresist is imageable with radiation from about 240 nm to about 12 nm.

20. The process of claim 18, where the second antireflective coating layer comprises silicon.

* * * * *